(12) United States Patent
Cobianu et al.

(10) Patent No.: US 8,317,392 B2
(45) Date of Patent: Nov. 27, 2012

(54) SURFACE ACOUSTIC WAVE BASED MICRO-SENSOR APPARATUS AND METHOD FOR SIMULTANEOUSLY MONITORING MULTIPLE CONDITIONS

(75) Inventors: Cornel Cobianu, Bucharest (RO); Ioan Pavelescu, Bucharest (RO); Mihal Gologanu, Bucharest (RO)

(73) Assignee: Honeywell International Inc., Morristown, NJ (US)

( * ) Notice: Subject to any disclaimer, the term of this patent is extended or adjusted under 35 U.S.C. 154(b) by 633 days.

(21) Appl. No.: 12/353,069

(22) Filed: Jan. 13, 2009

(65) Prior Publication Data

US 2010/0158071 A1 Jun. 24, 2010

Related U.S. Application Data

(60) Provisional application No. 61/140,279, filed on Dec. 23, 2008.

(51) Int. Cl.
*G01K 11/26* (2006.01)
*G01P 15/09* (2006.01)
*H03H 9/02* (2006.01)

(52) U.S. Cl. ............ 374/117; 374/E11.012; 310/313 B; 73/514.28

(58) Field of Classification Search .................. 374/117, 374/118, 119, 120, 187, 194, 195, 55, E11.012; 257/416; 310/313 B, 313 R; 73/514.28
See application file for complete search history.

(56) References Cited

U.S. PATENT DOCUMENTS

| | | | |
|---|---|---|---|
| 3,978,731 A * | 9/1976 | Reeder et al. .................... | 73/703 |
| 4,100,811 A | 7/1978 | Cullen et al. | |
| 4,295,102 A | 10/1981 | Schmidt et al. | |
| 4,332,342 A | 6/1982 | Gilden et al. | |
| 4,598,587 A | 7/1986 | Dwyer et al. | |
| 4,621,530 A | 11/1986 | Dwyer et al. | |
| 5,129,262 A * | 7/1992 | White et al. .................... | 73/599 |
| 5,233,213 A * | 8/1993 | Marek ............................. | 257/415 |
| 5,821,425 A | 10/1998 | Mariani et al. | |

(Continued)

FOREIGN PATENT DOCUMENTS

DE 10215834 11/2003

(Continued)

OTHER PUBLICATIONS

Benes et al., "Comparison between BAW and SAW Sensor Principles," IEEE International Frequency Control Symposium, pp. 5-20, 1997.

(Continued)

*Primary Examiner* — R. A. Smith
(74) *Attorney, Agent, or Firm* — Seager Tufte & Wickhem LLC (57) ABSTRACT

A SAW-based micro-sensor apparatus for simultaneously monitoring acceleration/vibration and temperature utilizing a sensing element configured as a SAW device (e.g., SAW resonator or SAW delay line). The SAW device can be located in different locations on a substrate with respect to a thin piezoelectric diaphragm comprising an inertial mass. The temperature-compensated acceleration/vibration can be measured utilizing a frequency difference between an acceleration sensitive SAW resonator (e.g., SAW-g) and a temperature sensitive SAW resonator (e.g., SAW-T). The temperature can be measured utilizing a frequency shift provided by the SAW-T and a temperature reference SAW resonator (e.g., SAW-R). Similarly, the phase response of different reflectors of the SAW delay line can be utilized to differentially measure the acceleration/vibration and temperature.

21 Claims, 6 Drawing Sheets

U.S. PATENT DOCUMENTS

| | | | |
|---|---|---|---|
| 6,003,378 A | 12/1999 | Scherr et al. | |
| 6,335,667 B1 | 1/2002 | Takagi et al. | |
| 6,448,624 B1* | 9/2002 | Ishio et al. | 257/417 |
| 6,553,836 B2 | 4/2003 | Williams | |
| 6,640,613 B2 | 11/2003 | Rapp et al. | 73/24.01 |
| 6,758,089 B2 | 7/2004 | Breed et al. | |
| 6,826,960 B2* | 12/2004 | Schaad et al. | 73/514.29 |
| 7,082,835 B2 | 8/2006 | Cook et al. | |
| 7,100,451 B2 | 9/2006 | Solie | |
| 7,109,632 B2 | 9/2006 | van Knokke | |
| 7,127,373 B2 | 10/2006 | House et al. | 702/182 |
| 7,129,828 B2 | 10/2006 | Cook | |
| 7,165,298 B2 | 1/2007 | Ehlers et al. | |
| 7,243,547 B2 | 7/2007 | Cobianu et al. | |
| 7,254,521 B2 | 8/2007 | Dauss et al. | 702/184 |
| 7,260,501 B2 | 8/2007 | Pattipatti et al. | 702/183 |
| 7,318,349 B2* | 1/2008 | Vaganov et al. | 73/514.33 |
| 7,343,804 B2 | 3/2008 | Liu et al. | 73/649 |
| 7,353,710 B2* | 4/2008 | Oikawa et al. | 73/703 |
| 7,368,312 B1* | 5/2008 | Kranz et al. | 438/48 |
| 7,387,435 B2* | 6/2008 | Kishi | 374/117 |
| 7,392,706 B2* | 7/2008 | Momose et al. | 73/706 |
| 7,576,470 B2 | 8/2009 | Kumar et al. | |
| 2003/0005759 A1 | 1/2003 | Breed et al. | |
| 2006/0075820 A1* | 4/2006 | Cobianu et al. | 73/703 |
| 2006/0179918 A1 | 8/2006 | Liu | |
| 2006/0238078 A1 | 10/2006 | Liu | |
| 2007/0079656 A1* | 4/2007 | Cook et al. | 73/514.34 |
| 2007/0107516 A1 | 5/2007 | Fujimoto et al. | 73/579 |
| 2007/0107519 A1 | 5/2007 | Liu et al. | 73/649 |
| 2007/0114889 A1 | 5/2007 | Cobianu et al. | 310/338 |
| 2007/0234730 A1 | 10/2007 | Markham et al. | 60/772 |
| 2007/0274371 A1* | 11/2007 | Penavaire et al. | 374/117 |
| 2008/0001685 A1 | 1/2008 | Liu | 333/193 |
| 2008/0006379 A1 | 1/2008 | Regan et al. | 162/109 |

FOREIGN PATENT DOCUMENTS

| | | |
|---|---|---|
| JP | 03257374 A * | 11/1991 |
| JP | 10242534 A * | 9/1998 |
| JP | 2009092622 A * | 4/2009 |
| JP | 2010151630 A * | 7/2010 |
| WO | WO 02/20287 | 3/2002 |
| WO | WO 02/31461 | 4/2002 |
| WO | WO 03/058231 A1 | 7/2003 |
| WO | WO 03/078950 | 9/2003 |
| WO | WO 03/079725 A3 | 9/2003 |
| WO | WO 03/081195 | 10/2003 |
| WO | WO 2004/017235 A1 | 2/2004 |
| WO | WO 2007/028817 A2 | 3/2007 |
| WO | WO 2007/061831 A1 | 5/2007 |
| WO | WO 2007/146424 A2 | 12/2007 |
| WO | WO 2008/102577 A1 | 8/2008 |

OTHER PUBLICATIONS

Buff, et al., "Passive Remote Sensing for Temperature and Pressure Using SAW Resonator Devices," IEEE Transactions on Ultrasonics, Ferroelectrics, and Frequency Control, vol. 45, No. 5, pp. 1388-1392, Sep. 1998.

Reindl et al., "SAW Devices as Wireless Passive Sensors," IEEE Ultrasonics Symposium, pp. 363-367, 1996.

Reindl, et al., "Theory and Application of Passive SAW Radio Transponders as Sensors, IEEE Transactions on Ultrasonics, Ferroelectrics, and Frequency Control," vol. 45, No. 5, pp. 1281-1292, Sep. 1998.

Scherr et al., "Quartz Pressure Sensor Based on SAW Reflective Delay Line," IEEE Ultrasonics Symposium, pp. 347-350, 1996.

Schimetta et al., "Optimized Design and Fabrication of a Wireless Pressure and Temperature Sensor Unit Based on SAW Transponder Technology," IEEE MTT-S International Microwave Symposium Digest, pp. 355-358, 2001.

Scholl et al., "Wireless Passive SAW Sensor Systems for Industrial and Domestic Applications, IEEE International Frequency Control Symposium," pp. 595-601, 1998.

Tiersten, et al., "An Analysis of the Normal Acceleration Sensitivity of ST-Cut Quartz Surface Wave Resonators Rigidly Supported Along the Edges," 41st Annual Frequency Control Symposium, pp. 282-288, 1987.

Reindl, "Wireless Passive SAW Identification Marks and Sensors," 2002 IEEE International Frequency Control Symposium and PDA Exhibition, New Orleans, LA, USA, 115 pages, May 29-31, 2002.

* cited by examiner

FIG. 12

SURFACE ACOUSTIC WAVE BASED MICRO-SENSOR APPARATUS AND METHOD FOR SIMULTANEOUSLY MONITORING MULTIPLE CONDITIONS

CROSS-REFERENCE TO PROVISIONAL APPLICATION

This application claims priority to U.S. Provisional Patent Application Ser. No. 61/140,279, entitled "Surface Acoustic Wave Based Micro-Sensor Apparatus and Method for Simultaneously Monitoring Multiple Conditions," which was filed on Dec. 23, 2008, and is incorporated herein by reference.

TECHNICAL FIELD

Embodiments are generally related to Surface Acoustic Wave (SAW) sensing devices and applications. Embodiments are also related to micro electromechanical systems (MEMS). Embodiments are additionally related to SAW-based micro-sensor devices that are capable of simultaneously monitoring one or more conditions such as, for example, acceleration, vibration, temperature and/or other parameters.

BACKGROUND OF THE INVENTION

SAW devices, such as delay lines and resonators, are known for measuring acceleration, stress, strain, temperature, pressure, and/or other parameters. In general, SAW devices can be fabricated on a piezoelectric substrate such as, for example quartz, lithium niobate, lithium tantalate, lanthanum gallium silicate and the like. Such SAW devices typically include one or more pairs of intertwined interdigital structures that are capable of converting applied electrical signals into electro-mechanical surface acoustic waves. Surface acoustic waves generated by applying the electrical signal on the inter-digital structure have propagation velocities that are sensitive to changes in stress and temperature of the substrate. Thus, all external parameters leading to a change in the stress and temperature of the SAW device can be detected. Such changes may be identified in terms of the shift of the resonance frequency associated with SAW resonators, or in terms of the delay time or phase shift of electrical signals emanating from SAW delay line components, by piezoelectric effect.

Real-time structural health monitoring of assets (SHMA) is a key strategy of industrial process control for condition-based maintenance (CBM) and thus, it can be employed as an intelligent alternative to present scheduled-based maintenance operations. The CBM approach can be employed to maximize the continuous operation time of running equipment and reduce maintenance costs to a minimum level. CBM can be preceded by a proper definition of normal operating conditions for the equipment as per its specification, as well as a deep understanding of failure mechanisms of the asset under consideration. As a result of these considerations, small sized, wireless and/or passive sensors can be employed for solving SHM requirements in order to constantly monitor the "pulse" of the equipment and provide an alert signal to an operator when a threshold value of a physical vital parameter is out of a specific range.

Along these same lines, moving mechanical parts are typically the weak point of many industrial or automotive components. The wear and tear experienced by such moving mechanical parts can generate changes in their ability to operate, particularly in terms of noise, excessive vibration, excessive heating, and fluid leak, which finally determine malfunction and overall failure. Furthermore, usage of such assets beyond their normal operating regime, without being detected in time can result in other components becoming defective and thus, a costly failure may result. The SHM of moving/rotating parts of such assets is complex as such an approach requires a wireless sensor to be located on or very close to the moving part in order to wirelessly communicate with an electronic reader placed in a static location with respect to the equipment to be monitored.

Based on the foregoing, it is believed that a need exists for an improved multi-measurand SAW-based micro-sensor apparatus and method for simultaneously monitoring parameters/conditions such as, for example, acceleration, vibration and temperature of particular assets in order to generate a warning signal to an operator regarding the measurands at a specified location. A need also exists for a wireless and/or wired SAW-based sensor apparatus capable of carrying out such features.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for improved SAW-based sensing devices and applications.

It is another aspect of the present invention to provide for an improved SAW-based micro-sensor configured by micro-machined technology.

It is yet a further aspect of the present invention to provide for an improved ultra-low size multi-measurand MEMS-based SAW sensor It is also an aspect of the present invention to provide for an improved two-terminal SAW-based micro-sensor apparatus and method thereof for simultaneously monitoring temperature-compensated acceleration/vibration and temperature.

The aforementioned aspects and other objectives and advantages can now be achieved as described herein. A SAW-based micro-sensor apparatus and method for simultaneously monitoring parameters such as, for example, acceleration/vibration and temperature, utilizing a sensing element configured in the context of a SAW device (e.g., SAW resonator or SAW delay line) is disclosed. The SAW device can be located in different locations on a substrate with respect to a thin piezoelectric diaphragm comprising an inertial mass. The temperature-compensated acceleration/vibration can be measured utilizing a frequency difference between an acceleration sensitive SAW resonator (SAW-g) and a temperature sensitive SAW resonator (SAW-T), both resonators being aligned to the same crystal direction. The temperature can be measured utilizing a frequency shift provided by the SAW-T and a temperature reference SAW resonator (SAW-R), the reference resonator being aligned to a quartz direction with a different temperature coefficient of frequency. Similarly, the phase response of different reflectors associated with the SAW delay line can be utilized to differentially measure the acceleration/vibration and temperature. The inertial mass suspended with, for example, four bridges, can be utilized for high sensitivity of acceleration detection.

In one embodiment, the three identical SAW resonators (e.g., SAW-R, SAW-T and SAW-g) can be connected electrically in parallel on the substrate. The SAW-T can be located on a stress free region above the inertial mass, the SAW-g can be located on a high stress region of the diaphragm, near the inertial mass, and the SAW-R can be located on a rim on the stress free region. Alternatively, the g sensitive SAW resonator can be located on a radial high stress region near the rim; while the remaining SAW resonators can be located on stress free regions (rim) external to the diaphragm.

In another embodiment, the SAW delay line can be located on a stress free region above the inertial mass and the g sensitive reflectors of the SAW delay line can be located on a stressed region of the diaphragm. The temperature sensitive reflectors can be located on stress free regions outside the diaphragm and on the stressed region of the diaphragm. The reflectors can be tilted in different angles with respect to the direction of an inter-digital transducer for temperature measurement.

Alternatively, the IDT and the temperature sensitive reflectors can be located on the rim, in a stress free region, while the g-sensitive reflectors can be located in the compressive radial stress region of the diaphragm provided with inertial mass. Yet, another embodiment can involve a configuration in which the IDT and the temperature sensitive reflectors are located on the stress free region above the inertial mass, while only the g sensitive reflectors of the SAW delay line can be located on the stress region of the diaphragm.

The micro-sensor apparatus converts the electrical energy to electro-mechanical energy (e.g., surface acoustic waves) by piezoelectric effect. The propagation velocity of the SAW waves is sensitive to stress and temperature of the SAW device. The change of propagation velocity due to acceleration/vibration and temperature will further change the resonance frequency (e.g., for SAW resonators) or the delay time or phase shift of the SAW delay line. Such a low cost, miniaturized, high performance, wireless/wired, two-terminal SAW-based sensor apparatus measure temperature-compensated acceleration/vibration and temperature by utilizing the piezoelectric substrate.

The two terminals of the micro-sensor can be connected to an antenna for wireless operation and can be located in a positive feedback loop of an oscillator for wired operation.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
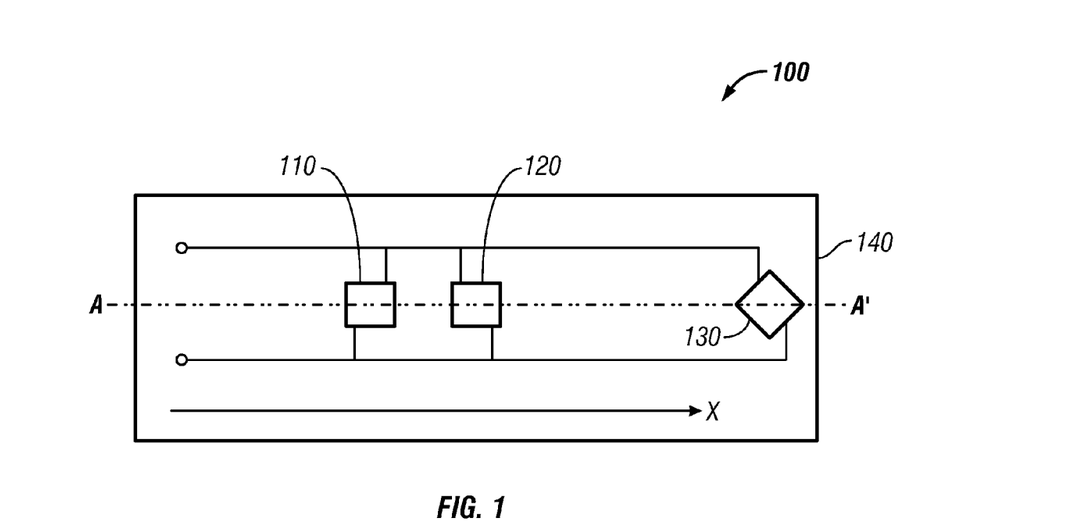
FIGS. 1-2 illustrate top and cross-sectional views of a SAW-based micro-sensor apparatus comprising three identical SAW resonators electrically connected in parallel for monitoring acceleration/vibration and temperature, in accordance with a preferred embodiment.
Figure 2:
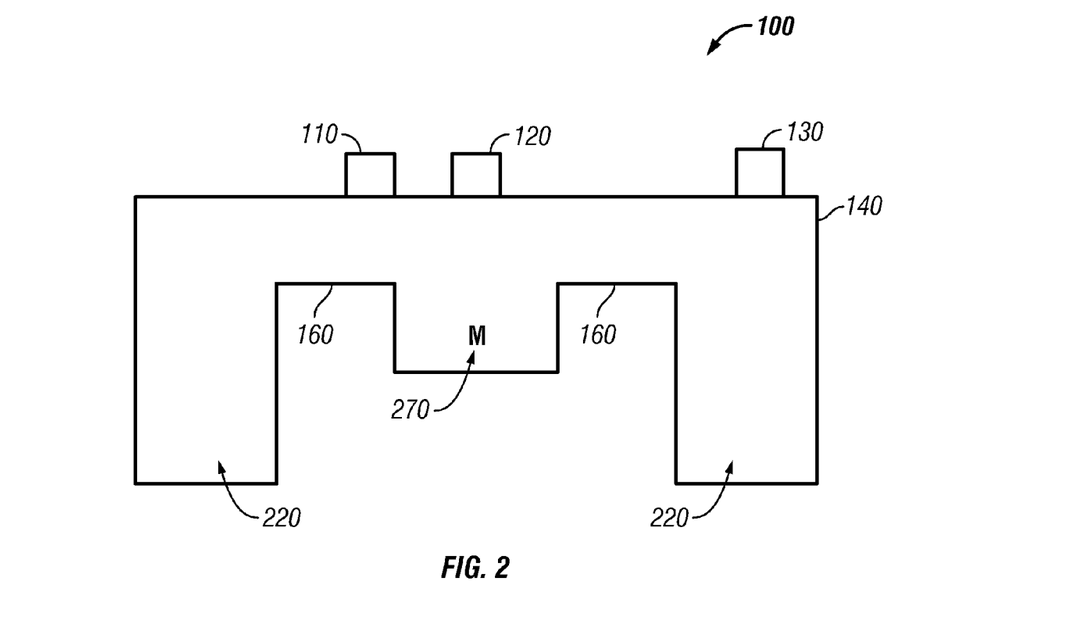

FIGS. 1-2 illustrate top and cross-sectional views of a SAW-based sensor apparatus 100 comprising three identical SAW resonators 110, 120 and 130 for monitoring acceleration/vibration and temperature, in accordance with a preferred embodiment. The SAW-based micro-sensor apparatus 100 generally includes three identical SAW resonators such as an acceleration/vibration sensitive SAW resonator (SAW-g) 110, a temperature sensitive SAW resonator (SAW-T) 120 and a temperature reference SAW resonator (SAW-R) 130. The three identical SAW resonators 110, 120 and 130 can be connected electrically in parallel on a piezoelectric substrate 140.

As shown in FIG. 1-2, the SAW-T resonator 120 can be located on a stress free region 270 above an inertial mass M and the SAW-g resonator 110 can be located on a stress region 210 (same sign radial and tangential stress) of the diaphragm 160 provided near the inertial mass M, 270. In the example depicted in FIG. 4, the SAW-g resonator is located on a tensile stress region, for which the positive sign is considered. The temperature reference SAW-R resonator 130 can be located on stress free region 230 (e.g., see FIG. 2) outside the diaphragm 160. Note that the stress free regions 210 and 230 are not depicted in FIG. 2, but are illustrated in FIG. 3.

The inertial mass M is needed for acceleration sensing. The SAW resonators 110, 120 and 130 can be configured to comprise an intertwined interdigital transducer for generating a surface acoustic wave (SAW) through which different measurand such as temperature and/or acceleration/vibration can be sensed. The temperature-compensated acceleration/vibration can be measured utilizing the frequency difference between the SAW-g resonator 110 and the SAW-T resonator 120, and the temperature can be measured utilizing the frequency shift provided by the SAW-T resonator 120 and the temperature reference SAW-R resonator 130. Different values of propagation velocities and their temperature dependencies can be measured in different directions for temperature measurement utilizing the SAW-T resonator 120.

The temperature reference SAW-R resonator 130 can be rotated with respect to x-axis as indicated by the crystal line A-A' with a specified angle. The angle can be chosen so that the velocity change with temperature possesses a minimum value on that direction with respect to other directions, which can assure minimum temperature coefficient of resonating frequency. The existence of a frequency shift between the SAW-T resonator 120 and the temperature reference SAW-R resonator 130 can be explained by the crystal anisotropy, wherein the temperature effect on propagation velocity is different on different directions.

Figure 3:
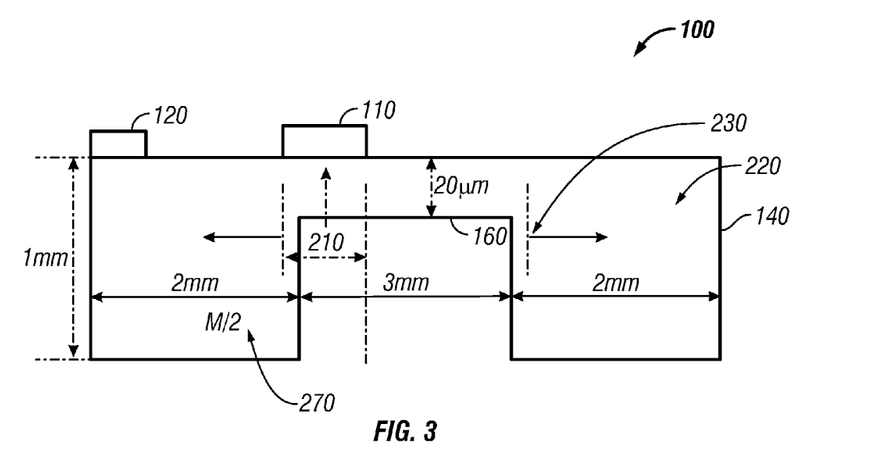
FIG. 3 illustrates a cross-sectional view of the left-half of the SAW-based micro-sensor apparatus, rotated with 180 degrees, in accordance with FIGS. 1-2 and a preferred embodiment.

FIG. 3 illustrates a cross-sectional view of half a SAW-based micro-sensor apparatus 100. Note that FIG. 3 further illustrates detailed geometrical dimensions of the SAW-based micro sensor apparatus 100. The thickness of the diaphragm is 20 μm. The cylindrical inertial mass M having diameter 4 mm and height 1 mm. The width of the region 230 on the rim 220 can be chosen from mechanical robustness reasons and the region 230 can be stress free region of the rim 220 on which the SAW-T and/or SAW-R resonators 120 and 130 can be placed as described in FIG. 1. Similarly, the SAW-T or SAW-R resonators can be located on the stress free region of the inertial mass 270. These dimensions are described for purposes of clarity and specificity; however, they should not be interpreted in any limiting way. In general, the positive stress is tensile and the negative stress is compressive. The SAW-g resonator 110 can be located on the tensile stress region 210 of the diaphragm 160 hence, both radial and tangential stresses are tensile. There is no stress on the inertial mass region M except a small edge region as shown in FIG. 3.

Figure 4:
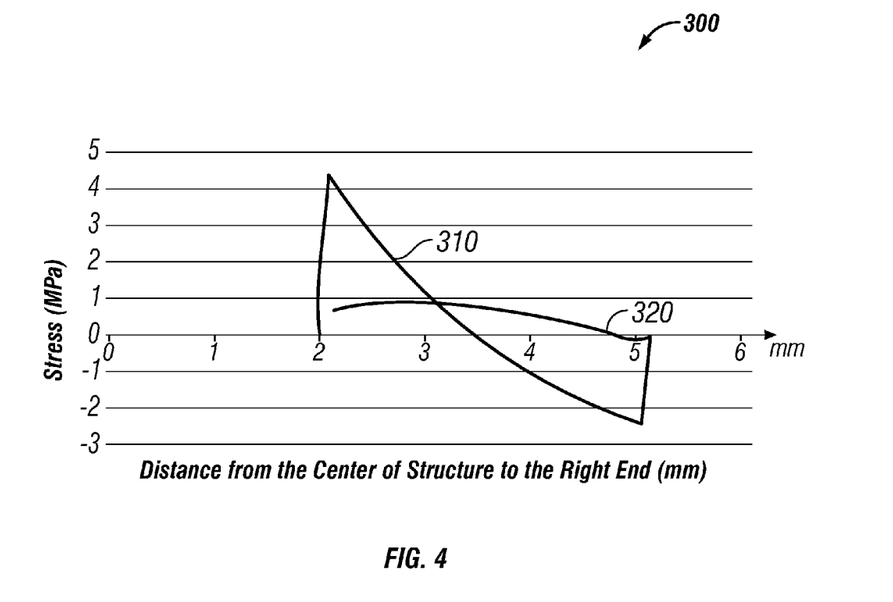
FIG. 4 illustrates a graphical representation depicting radial and tangential stresses for an acceleration of 10 g applied to the SAW-based micro-sensor apparatus, in accordance with FIGS. 1-3 and an exemplary embodiment.

FIG. 4 illustrates a graphical representation 300 depicting radial stress 310 and tangential stress 320 for an acceleration of 10 g applied to the SAW-based sensor apparatus 100, in accordance with a preferred embodiment. Note that in FIGS. 1-12, identical or similar blocks are generally indicated by identical reference numerals. The radial stress 310 and the tangential stress 320 are positive (tensile) stresses on the region 210 (i.e., on the diaphragm 160 near the inertial mass region 270), and the SAW-g resonator 110 can be located on this region for measuring the acceleration/vibration. The stress 310 can be measured in mega Pascal (MPa), which can be plotted on the y axis while the distance from the center of structure measured in millimeters (mm), can be plotted on the x-axis. Note that the embodiments discussed herein should not be construed in any limited sense. It can be appreciated that such embodiments reveal details of the structure of a preferred form necessary for a better understanding of the invention and may be subject to change by skilled persons within the scope of the disclosed embodiments without departing from the concept thereof.

Figure 5:
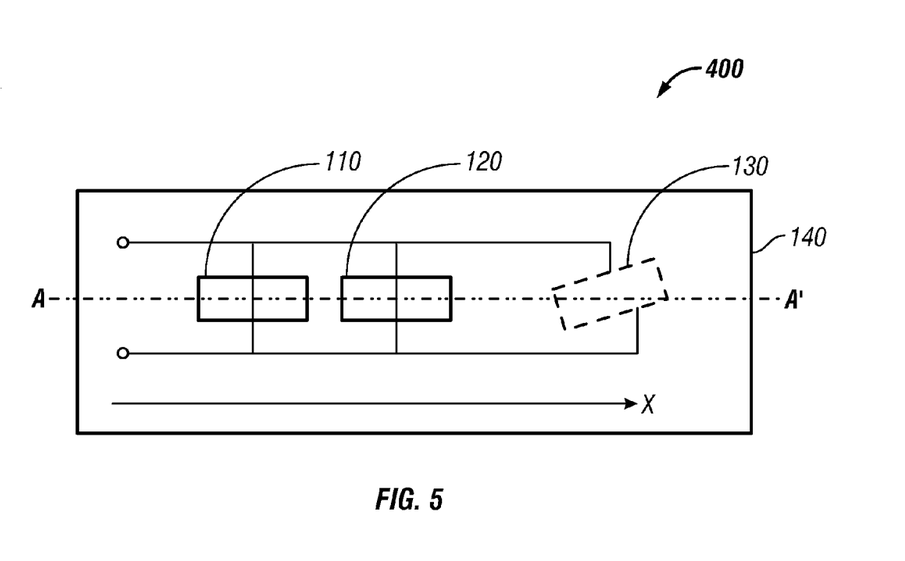
FIGS. 5-6 illustrate top and cross-sectional views of a SAW-based micro-sensor apparatus comprising three identical SAW resonators electrically connected in parallel for monitoring acceleration/vibration and temperature, which can be implemented in accordance with an alternative embodiment.
Figure 6:
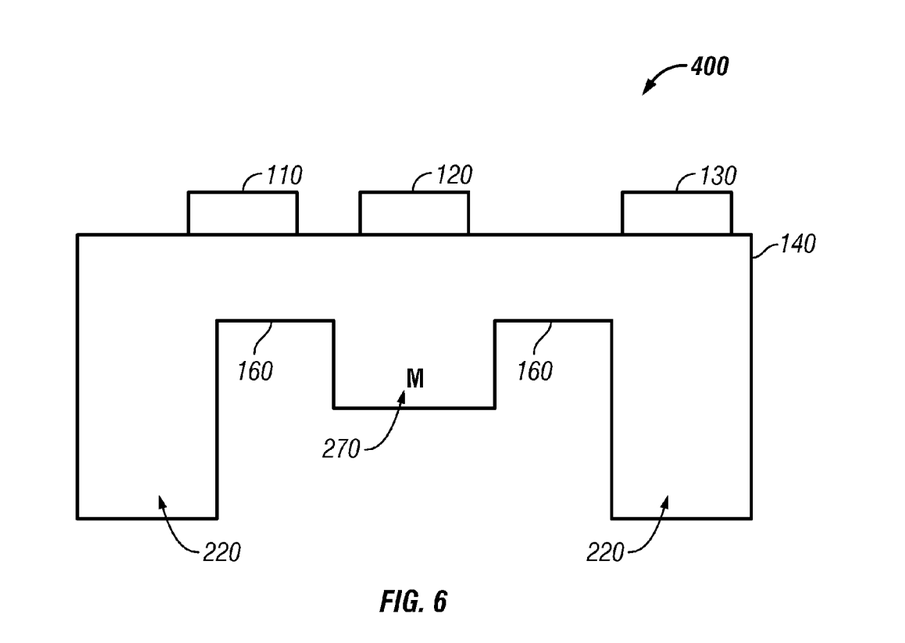

FIGS. 5-6 illustrate top and cross-sectional views of a SAW-based micro-sensor apparatus 400 comprising three identical SAW resonators 110, 120 and 130 for monitoring acceleration/vibration and temperature, which can be implemented in accordance with an alternative embodiment. The micro-sensor apparatus 400 comprises SAW-g, SAW-T and SAW-R resonators 110, 120 and 130, respectively, that are electrically connected in parallel on the piezoelectric substrate 140.

The SAW-g resonator 110 can be located in the region with compressed radial stress of the diaphragm 160, near the rim 220, as shown in FIG. 6, the SAW-T resonator 120 can be located on the inertial mass region 270, and the temperature reference SAW-R resonator 130 can be located on the rim 220, outside the diaphragm 160 and the inertial mass region M, 270. The SAW-g and SAW-T resonators 110 and 120, respectively, can be utilized for temperature-compensated differential measurement of acceleration/vibration, wherein the SAW-T resonator 120 is the reference sensor for the SAW-g 110, for temperature-compensation effects when measuring the vibration/acceleration. The SAW-T and SAW-R resonators 120 and 130, respectively, can be located on stress free regions 270 and 220, respectively of piezoelectric substrate 140 and they can be utilized for differential measurement of temperature. The inertial mass M can be utilized for generating strain in the circular diaphragm 160 due to external acceleration to be measured.

Figure 7:
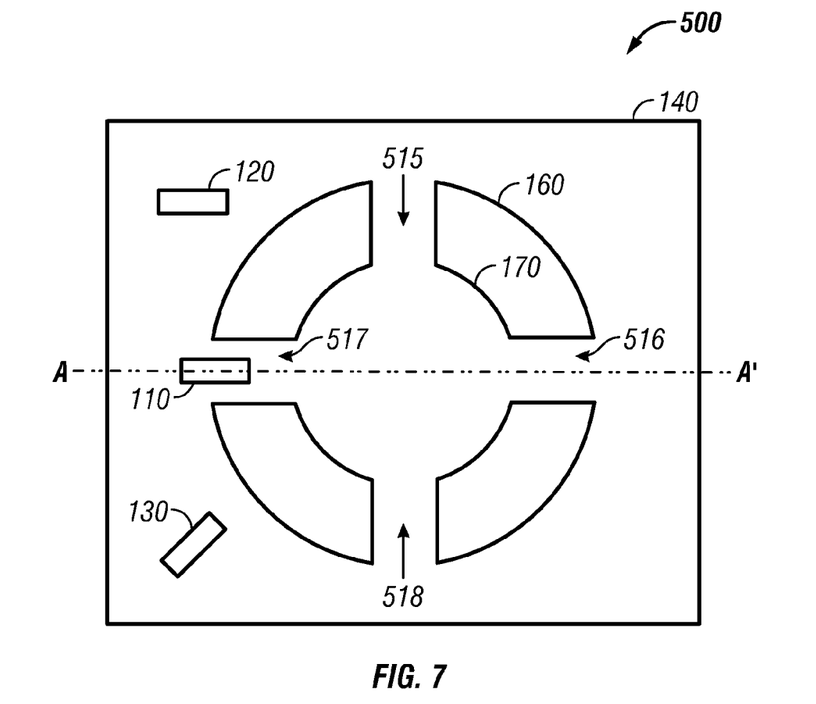
FIGS. 7-8 illustrate top and cross-sectional views of a SAW-based micro-sensor apparatus with high g-sensitivity structures based on MEMS technology, in accordance with a preferred embodiment.
Figure 8:
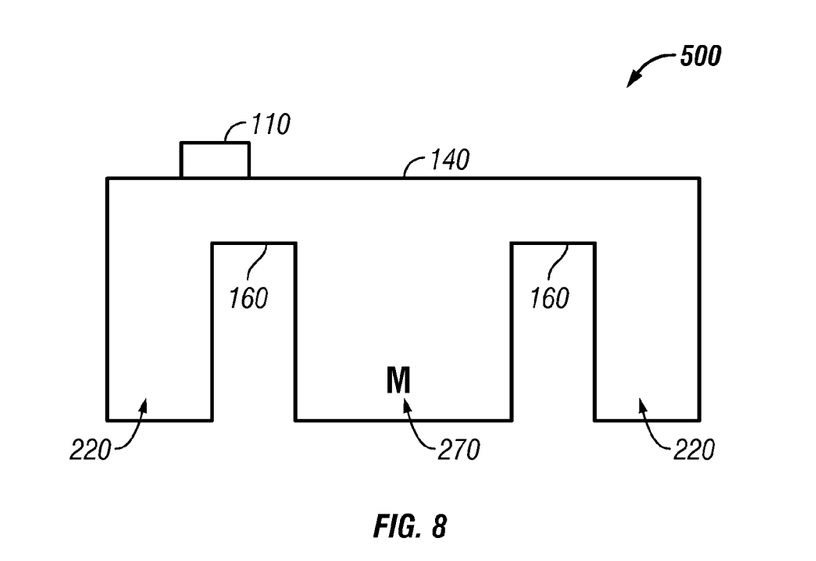

FIGS. 7-8 illustrate top and cross-sectional views of the SAW-based micro-sensor apparatus 500 with high g-sensitivity structures based on MEMS technology, in accordance with a preferred embodiment. The SAW sensor 500 comprises a number of bridges 515, 516, 517 and 518, and SAW-g, SAW-T and SAW-R resonators 110, 120 and 130, respectively, on the substrate 140. Only the bridges 515, 516, 517 and 518 are supporting the suspended inertial mass region 270, which is otherwise surrounded by empty holes on the piezoelectric substrate 140, as that hole between the edges 170 and 160 in FIG. 7.

The SAW-g resonator 110 can be placed on the bridge 517, near the rim 220, on the negative stress region, while the SAW-T and the SAW-R resonators 120 and 130, respectively can be placed outside the diaphragm 160 and the inertial mass 270 in the stress free region. The inertial mass M can be supported by the plurality of bridges 515, 516, 517 and 518 for high sensitivity acceleration measurement. Note that the SAW-g sensor 110 can be located either in the compressive stress region near the rim 220, as shown in FIGS. 7-8, or on the same bridge, or near the inertial mass, in the tensile stress region (not shown).

Note that the aforementioned embodiments discuss the use of three SAW resonators connected in parallel for measuring differentially the vibration/acceleration and the temperature itself, which can be adapted for use in configuring a wireless micro-sensor, when an antenna is attached to the above resonators and connected in parallel in order to obtain a micro-sensing apparatus for wireless detection of the described measurands. An alternative use of the aforementioned three SAW resonators connected in parallel in accordance with a different embodiment, can be connected in the context of feed-back of an electronic oscillator for obtaining a wired SAW-based micro-apparatus for differentially measuring the acceleration/vibration and the temperature itself of a rigid location, wherein such components are located as required per a specific application.

Figure 9:
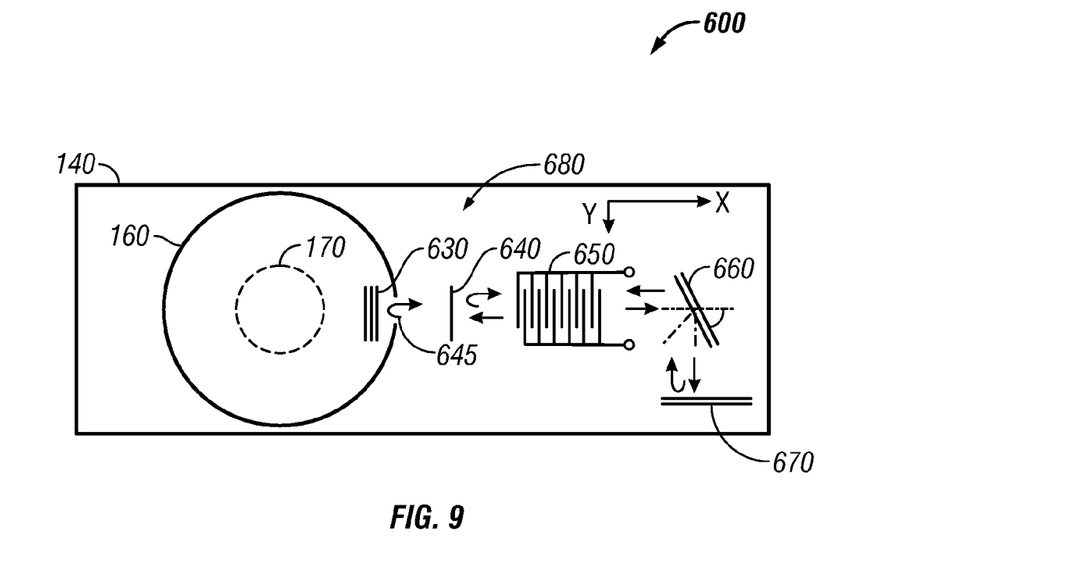
FIGS. 9-10 illustrate top and cross-sectional views of a SAW-based micro-sensor apparatus comprising a single SAW delay line with multiple reflectors for monitoring acceleration/vibration and temperature, in accordance with a preferred embodiment.
Figure 10:
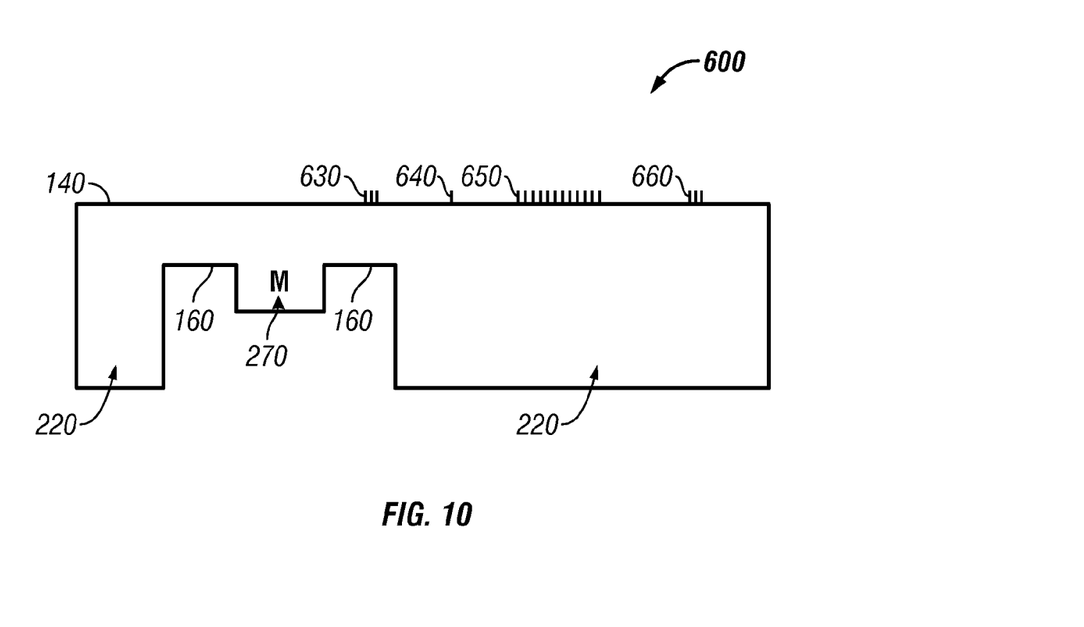

FIGS. 9-10 illustrate top and cross-sectional views of a SAW-based micro-sensor apparatus 600 comprising SAW delay line for monitoring acceleration/vibration and temperature, in accordance with a preferred embodiment. The micro-sensor apparatus 600 generally includes an interdigital transducer (IDT) 650 that can be located on a stress free region 680 of the piezoelectric substrate 140 for generating the surface acoustic wave 645, moving on different directions, as per reflectors utilized for changing its trajectory. A reflector 640 can be located on the stress free region 680. A group of reflectors 630 can be located on the region with compressive tangential stress, as shown in FIG. 9.

The apparatus 600 can be further configured to include a group of reflectors 660 thereby forming an alpha angle with an axis x and another group of reflectors 670. The surface acoustic wave 645 can be reflected by the reflectors 630, 640, 660 and 670 to generate echo acoustic waves that carry the information regarding the differential measurement of vibration/acceleration (e.g., waves reflected by reflectors 630 and 640) and differential measurement of temperature (e.g., waves reflected by reflectors 645, 660 and 670). The propagation velocity of the surface acoustic wave 645 reflected from reflectors 630 depends generally on the propagation direction and strain of the piezoelectric substrate 140.

Similarly, temperature coefficient of velocity depends on propagation direction. The delay time of acoustic signal coming back from the reflectors 630, 640, 660 and 670 depends on its velocity, which in addition depends on stress/strain and temperature on the traveled region. The strain in the diaphragm 160 depends on the inertial force created by mass M, when acceleration is present. The contour of inertial mass M under the surface of the diaphragm 160 is indicated by a dashed circle 170. The acoustic signals received from the reflectors 630 and 640 can be utilized for differential acceleration/vibration measurement.

The signals received by the IDT 650 from the reflectors 640 and 670 can be utilized for temperature measurement. As depicted in FIG. 5, the teeth of the inter-digital (IDT) structure 650 and the reflectors 630 and 640 can be located perpendicular to the direction x, and the reflectors 660 and 670 can be located at different angles with respect to x axis, in order to provide differences in the propagation velocity on different directions for temperature measurement. The IDT 650 can be utilized for the generation of the acoustic wave from an electrical signal (piezoelectric effect) and the acoustic signal reflected from the reflectors 630, 640, 660 and 670 can be utilized for sensing measurand. Note that the double functionality of the IDT 650 as an acoustic wave generator and receptor is specific to wireless operation of the SAW devices, wherein an antenna is attached to the IDT 650, in this case.

The phase of the signals received from the reflectors 630 and 640 can be utilized for temperature compensated g/v measurement. The reflector 630 can be located in the region with negative radial stress of the diaphragm 160, wherein the velocity of acoustic is different with respect to other unstrained regions on the same direction within the sensor apparatus 600, while the reflector 640 will provide the reference to the sensor providing the acoustic signal coming from a stress free region. The phases of the signals received from reflectors 640 and 670 can be utilized for temperature measurement, as explained above. The phase response of different reflectors 630 and 640 of SAW delay line can be utilized to measure differentially the temperature-compensated acceleration-vibration.

As shown in FIG. 10, the IDT 650 of SAW delay line can be located on stress free region 680 and g sensitive reflectors 630 of SAW delay line can be located on the stressed region of the diaphragm 160. The temperature sensitive reflectors 640 and 670 can be located on stress free regions outside the diaphragm 160. The reflectors 660 and 670 can be tilted with different angles with respect to the direction of IDT 650 for temperature measurement. As shown in FIG. 10, metal lines 630, 640, 650 and 660 can be utilized for delay line and reflector realization.

Figure 11:
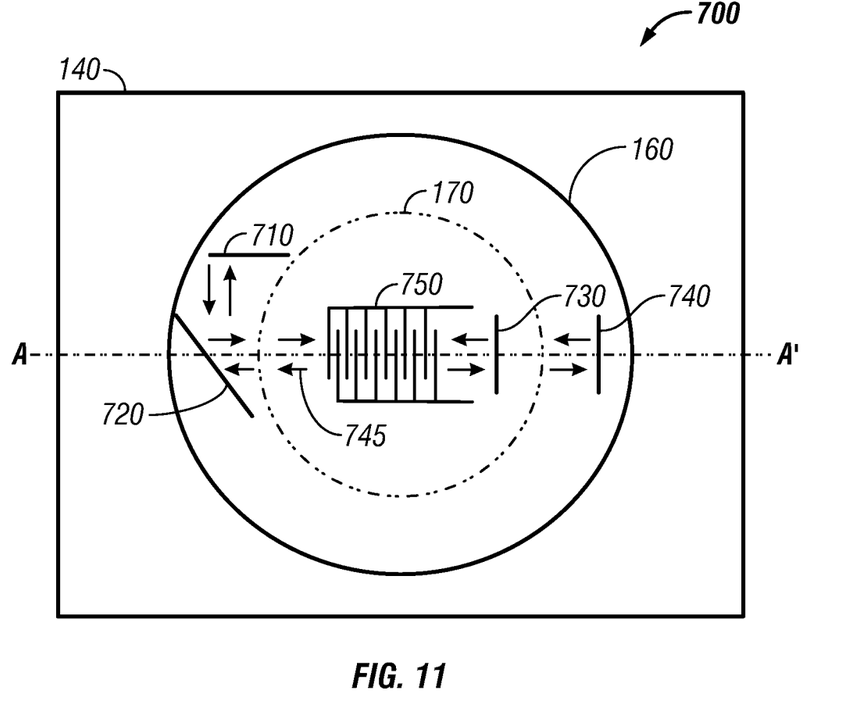
FIGS. 11-12 illustrate top and cross-sectional views of a SAW-based micro-sensor apparatus comprising a single SAW delay lines with multiple reflectors for monitoring acceleration/vibration and temperature, which can be implemented in accordance with an alternative embodiment.
Figure 12:
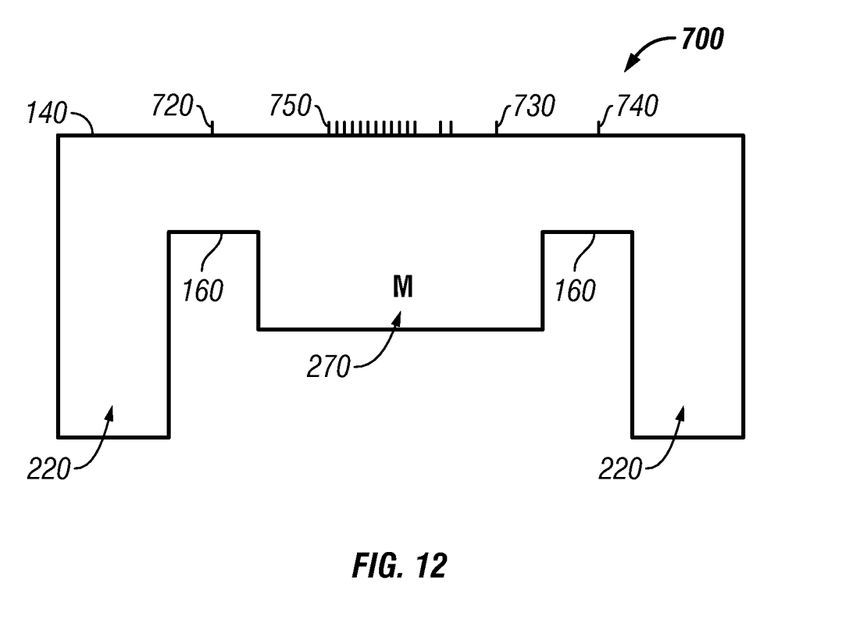

FIGS. 11-12 illustrate top and cross-sectional views of a SAW-based micro-sensor apparatus 700 comprising SAW delay lines for monitoring acceleration/vibration and temperature, which can be implemented in accordance with an alternative embodiment. Again, as reminder, in FIGS. 1-12, identical or similar blocks are generally indicated by identical reference numerals. The IDT 750 of the SAW delay line can be located above the inertial mass M, 270. The reflectors 710 and 720 for the differential temperature measurement can be located in the stress free region above inertial mass M (not shown in the FIGS. 11-12), which can be provided as an option. The reflectors 710 and 720 can also be located in the strained area of the diaphragm 160, as shown in FIG. 11.

The signals received back from reflectors 730 and 740 can be utilized for the differential measurement of acceleration/vibration. The signals received back from reflectors 730, 720 and 710 can be utilized for the measurement of temperature. The surface acoustic waves generated by applying an alternative electrical signal on the (comb) metal inter-digital structure 750 (i.e., piezoelectric effect) are propagating in opposite directions and reflected according to optical reflection principles. The IDT 750 and the temperature sensitive reflectors 730, 720 and 710 (reflector 710 is not shown in FIG. 12) can be located above the inertial mass 270 in the stress free region and the g-sensitive reflectors 740 can be located in the tensile radial stress region of the diaphragm 160 near the inertial mass M.

As illustrated in FIG. 12, which depicts a cross-sectional view through the axis A-A' of FIG. 11, the metal lines 720, 730 and 740, corresponding to the reflectors 720, 730 and 740, respectively, together with the specific metal pattern of IDT 750 can be utilized for delay line and reflector realization. Again, this SAW sensor configuration based on single delay line is automatically associated with the wireless operation wherein an antenna is attached to the IDT for receiving the electric signal from a reader antenna and sensing back the echo signal to the same reader, but this echo signal carries out the information about the physical amounts to be detected (e.g., temperature, acceleration/vibration, etc.). Two delay lines can be used in the case of wired applications, wherein the SAW delay line is located in the positive feed back loop of an electronic amplifier for making an electronic oscillator-based sensing circuit.

Such a micro-sensor apparatus 100, 400, 500, 600 and 700 monitors the acceleration/vibration and temperature (g/v & T) of assets in order to give a warning signal to a human operator about these measurand at a specified location. An actuator (not shown) can be set to take equipment control in terms of signaling or even closing off the operation of that equipment when g/v & T is above the normal specified range. The two-terminal micro-apparatus 100, 400, 500, 600 and 700 can be utilized for wired/wireless applications. The two terminals of the SAW micro-sensor can be connected to an antenna (not shown) for wireless operation and for the wired operation the sensor apparatus can be located in the positive feedback loop of an oscillator (not shown).

The micro-sensor apparatus can be multifunctional device acting in the same time as passive sensors and transceivers, which make them very attractive for wireless applications. The apparatus can be implemented by low cost MEMS technology for measuring both g/v & T by using a single chip and without the need for any battery for their operation. The miniaturized sensors can be applied even to small spaces and small-scale assets, in some cases it can be even embedded in the body of the assets.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A SAW-based micro-sensor apparatus, comprising:
   a piezoelectric containing substrate having a piezoelectric containing diaphragm that supports an inertial mass; and
   at least one sensing element configured as a SAW device;
   wherein said SAW device is for monitoring a plurality of conditions, including at least one of the following conditions: temperature-compensated acceleration/vibration and a temperature;
   wherein said piezoelectric containing diaphragm includes a tensile stress region, a compressive stress region and a boundary between the tensile stress region and the compressive stress region; and wherein said SAW device includes one or more acceleration/vibration sensitive elements supported by said tensile stress region of said piezoelectric containing diaphragm adjacent said inertial mass.

2. The apparatus of claim 1 wherein said piezoelectric containing diaphragm includes at least one bridge for assisting in a high-sensitivity acceleration/vibration detection of said plurality of conditions.

3. The apparatus of claim 2 wherein said SAW device comprises a SAW resonator.

4. The apparatus of claim 3 wherein:
a temperature sensitive SAW resonator and a temperature reference SAW resonator are located on a rim of said piezoelectric containing substrate; and
said one or more acceleration/vibration sensitive elements include an acceleration sensitive SAW resonator located on said tensile stress region, near said inertial mass of said piezoelectric containing diaphragm.

5. The apparatus of claim 3 wherein:
a temperature sensitive SAW resonator is located on a stress free region of said piezoelectric containing diaphragm above said inertial mass;
a temperature reference SAW resonator is located on a rim of the piezoelectric containing substrate that extends around and supports said piezoelectric containing diaphragm; and
said one or more acceleration sensitive elements includes an acceleration sensitive SAW resonator located on said tensile stress region, near said inertial mass, of said piezoelectric containing diaphragm.

6. The apparatus of claim 1 wherein said SAW device comprises at least one SAW resonator.

7. The apparatus of claim 6 wherein said at least one SAW resonator further comprises:
a temperature sensitive SAW resonator located on a stress free region of said piezoelectric containing diaphragm above said inertial mass; and
a temperature reference SAW resonator located on a rim of said piezoelectric containing substrate.

8. The apparatus of claim 6 wherein:
a temperature sensitive SAW resonator and a temperature reference SAW resonator are located adjacent a rim of said piezoelectric containing substrate; and
said one or more acceleration/vibration sensitive elements include an acceleration sensitive SAW resonator located on said tensile stress region of said piezoelectric containing diaphragm near said inertial mass.

9. The apparatus of claim 6 wherein a temperature sensitive SAW resonator, an acceleration sensitive SAW resonator and a temperature reference SAW resonator are connected electrically in parallel with one another on said piezoelectric containing substrate.

10. The apparatus of claim 1 wherein said SAW device comprises at least a SAW delay line.

11. The apparatus of claim 10 wherein said SAW delay line further comprises:
at least one inter-digital transducer located on a stress free region of the piezoelectric containing diaphragm above said inertial mass;
said one or more acceleration sensitive elements includes a plurality of acceleration sensitive reflectors located on said tensile stressed region of said piezoelectric containing diaphragm; and
a plurality of temperature sensitive reflectors located on said stress free region of the piezoelectric containing diaphragm above said inertial mass region, wherein said plurality of temperature sensitive reflectors is tilted with different angles with respect to a direction of said inter-digital transducer for said temperature measurement.

12. The apparatus of claim 1 wherein said piezoelectric containing diaphragm includes at least one bridge for assisting in a high-sensitivity acceleration detection of said plurality of conditions, wherein said SAW device comprises at least one SAW delay line.

13. The apparatus of claim 12 wherein:
said SAW delay line further comprises:
at least one inter-digital transducer located on a stress free region of said piezoelectric containing substrate;
said one or more acceleration/vibration sensitive elements comprises a plurality of acceleration sensitive reflectors located on said tensile stressed region of said piezoelectric containing diaphragm; and
a plurality of temperature sensitive reflectors located on said stress free region of said piezoelectric containing substrate, wherein said plurality of temperature sensitive reflectors is tilted with different angles with respect to a direction of said inter-digital transducer for said temperature measurement.

14. A SAW-based micro-sensor apparatus, comprising:
a piezoelectric containing substrate; and
at least one sensing element configured as a SAW device, wherein said SAW device is capable of being located in different positions on said piezoelectric containing substrate with respect to a piezoelectric containing diaphragm that comprises an inertial mass;
wherein said SAW device is for monitoring a plurality of conditions, including at least one of the following conditions: temperature-compensated acceleration/vibration and a temperature thereto;
wherein said SAW device comprises at least one SAW resonator, and said at least one SAW resonator further comprising:
a temperature sensitive SAW resonator located on a stress free region above said inertial mass;
an acceleration sensitive SAW resonator located on a tensile stress region of said piezoelectric containing diaphragm near said inertial mass;
a temperature reference SAW resonator located on a rim of said piezoelectric containing substrate;
wherein said temperature compensated acceleration/vibration is measured utilizing a frequency difference between said acceleration sensitive SAW resonator and said temperature sensitive SAW resonator; and
said temperature is measured utilizing a frequency shift provided by said temperature sensitive SAW resonator and said temperature reference SAW resonator.

15. A SAW-based micro-sensor apparatus, comprising:
a piezoelectric substrate having a piezoelectric diaphragm that supports an inertial mass;
at least one sensing element configured as a SAW device;
where said SAW device is for monitoring a plurality of conditions, including at least one of the following conditions: temperature-compensated acceleration/vibration and a temperature; and
wherein said SAW device comprises at least a SAW delay line, wherein said SAW delay line further comprises:
at least one interdigital transducer located on a stress free region above said inertial mass;
a plurality of acceleration/vibration sensitive reflectors located on a tensile stressed region of said piezoelectric diaphragm, and
a plurality of temperature sensitive reflectors located on said tensile stressed region of said diaphragm, wherein said plurality of temperature sensitive reflectors is tilted with different angles with respect to a direction of said inter-digital transducer for said temperature measurement.

16. A SAW-based micro-sensor apparatus, comprising:
a piezoelectric containing substrate having a piezoelectric containing diaphragm that supports an inertial mass;
at least one sensing element configured as a SAW device;
wherein said SAW device is for monitoring a plurality of conditions, including at least one of the following conditions: temperature-compensated acceleration/vibration and a temperature; and
wherein said SAW device comprises at least a SAW delay line, wherein said SAW delay line further comprises:
at least one interdigital transducer located on a stress free region on a rim of the piezoelectric containing substrate outside the said piezoelectric containing diaphragm;
a plurality of acceleration/vibration sensitive reflectors located on a tensile stressed region of said piezoelectric containing diaphragm; and
a plurality of temperature sensitive reflectors located on said stress free region on the rim of the piezoelectric containing substrate outside said piezoelectric containing diaphragm, wherein said plurality of temperature sensitive reflectors is tilted with different angles with respect to a direction of said inter-digital transducer for said temperature measurement.

17. A SAW-based micro-sensor apparatus, comprising:
a piezoelectric containing substrate; and
at least one sensing element configured as a SAW device, wherein said SAW device is capable of being supported by different portions of said piezoelectric containing substrate with respect to a piezoelectric containing diaphragm that comprises an inertial mass;
wherein said SAW device is for monitoring a plurality of conditions, including at least one of the following conditions: temperature-compensated acceleration/vibration and a temperature thereto;
wherein said piezoelectric containing substrate includes a tensile stressed region and a compressive stressed region and a boundary therebetween; and
wherein said SAW device comprises a saw resonator, the saw resonator comprises one or more acceleration/vibration sensitive elements supported by either the tensile stressed region or the compressive stressed region, but not both of the tensile stressed region and the compressive stressed region.

18. The apparatus of claim 17 wherein:
said one or more acceleration/vibration sensitive elements comprises an acceleration/vibration sensitive SAW resonator located on the compressive stress region near a rim of said piezoelectric containing substrate;
a temperature sensitive SAW resonator located on a stress free region above said inertial mass; and
a temperature reference SAW resonator spaced away from the rim of said piezoelectric containing substrate.

19. The apparatus of claim 17 wherein:
a temperature sensitive SAW resonator and a temperature reference SAW resonator are located adjacent a rim of said piezoelectric containing substrate; and
said one or more acceleration/vibration sensitive elements include an acceleration sensitive SAW resonator located on said compressive stress region of said piezoelectric containing diaphragm near said inertial mass.

20. The apparatus of claim 17 wherein:
a temperature sensitive SAW resonator and a temperature reference SAW resonator are located on a rim on said piezoelectric containing substrate; and
said one or more acceleration/vibration sensitive elements include an acceleration sensitive SAW resonator located on the compressive stress region of said piezoelectric containing diaphragm, which supports the inertial mass by at least one bridge.

21. The apparatus of claim 17 wherein:
a temperature sensitive SAW resonator is located above said inertial mass on a stress free region of the piezoelectric containing diaphragm;
a temperature reference SAW resonator is located on a rim and on a stress free region of the piezoelectric containing substrate; and
said one or more acceleration/vibration sensitive elements include an acceleration/vibration sensitive SAW resonator located on said compressive stress region of the piezoelectric containing diaphragm near said inertial mass, wherein the inertial mass is supported by at least one bridge.

* * * * *